United States Patent
Murakuki et al.

(10) Patent No.: US 7,835,169 B2
(45) Date of Patent: Nov. 16, 2010

(54) SEMICONDUCTOR MEMORY DEVICE AND SEMICONDUCTOR MEMORY SYSTEM

(75) Inventors: Yasuo Murakuki, Kyoto (JP); Yasushi Gohou, Osaka (JP); Shunichi Iwanari, Kyoto (JP); Masanori Matsuura, Osaka (JP); Yoshiaki Nakao, Osaka (JP)

(73) Assignee: Panasonic Corporation, Osaka (JP)

( * ) Notice: Subject to any disclaimer, the term of this patent is extended or adjusted under 35 U.S.C. 154(b) by 131 days.

(21) Appl. No.: 12/368,622

(22) Filed: Feb. 10, 2009

(65) Prior Publication Data

US 2009/0244951 A1   Oct. 1, 2009

(30) Foreign Application Priority Data

Mar. 27, 2008 (JP) .............................. 2008-083558

(51) Int. Cl.
G11C 11/22 (2006.01)
(52) U.S. Cl. ................. 365/145; 365/205; 365/207; 365/210.1; 365/230.03; 365/230.06
(58) Field of Classification Search ................ 365/145, 365/205, 207, 210.1, 230.03, 230.06
See application file for complete search history.

(56) References Cited

U.S. PATENT DOCUMENTS

| | | | |
|---|---|---|---|
| 6,097,622 A | 8/2000 | Shimizu et al. | |
| 6,956,760 B2 | 10/2005 | Kang | |
| 6,999,336 B2 | 2/2006 | Sakuma | |
| 2003/0002318 A1* | 1/2003 | Kang et al. | 365/145 |
| 2003/0218898 A1 | 11/2003 | Rickes et al. | |
| 2005/0013156 A1* | 1/2005 | Hoya et al. | 365/145 |
| 2005/0024915 A1* | 2/2005 | Kang | 365/145 |

FOREIGN PATENT DOCUMENTS

| | | |
|---|---|---|
| JP | 10-229171 A | 8/1998 |
| JP | 2004-005979 A | 1/2004 |

* cited by examiner

Primary Examiner—Hoai V Ho
(74) Attorney, Agent, or Firm—McDermott Will & Emery LLP

(57) ABSTRACT

A semiconductor memory device includes a plurality of memory cell arrays each including a plurality of memory cells arranged in a matrix pattern, and a plurality of cell plate lines each being shared by the memory cell arrays, each of the cell plate lines corresponding to each of rows of the memory cells and each of the cell plate lines being connected to the memory cells of a corresponding one of the rows. Each of the memory cell arrays includes a plurality of word lines each of which corresponds to each of the rows of the memory cells in the memory cell array. The number of the memory cells connected to each of the cell plate lines is larger than the number of the memory cells connected to one of the word lines corresponding to the each of the cell plate lines.

14 Claims, 18 Drawing Sheets

SEMICONDUCTOR MEMORY DEVICE AND SEMICONDUCTOR MEMORY SYSTEM

CROSS REFERENCE TO RELATED APPLICATION

This application claims priority under 35 U.S.C. §119 on Patent Application No. 2008-83558 filed in Japan on Mar. 27, 2008, the entire contents of which are hereby incorporated by reference.

BACKGROUND

The present invention relates to a semiconductor memory device and, more particularly, to a ferroelectric memory (Fe-RAM: Ferroelectric Random Access Memory).

FIG. 1 is a block diagram showing an example of a block arrangement in a conventional ferroelectric memory. FIG. 1 shows a circuit substantially equal to that shown in FIG. 6 of Japanese Laid-Open Patent Publication No. 10-229171. The ferroelectric memory of FIG. 1 includes memory cell arrays 110 and 111, cell plate drivers 120 and 121, a row decoder 130, a word line WL<0>, bit lines BL0<0>, XBL0<0>, BL1<0> and XBL1<0>, cell plate control lines PCP0 and PCP1, and cell plate lines CP0<0> and CP1<0>. Each of the memory cell arrays 110 and 111 includes m rows by n columns (where m and n are integers) of 2 transistors 2 capacitors (2T2C) ferroelectric memory cells 100 (101). The cell plate drivers 120 and 121 include cell plate driving elements 120A, 121A, . . . .

FIG. 2 is a block diagram showing another example of a block arrangement of a conventional ferroelectric memory. FIG. 2 shows a circuit substantially equal to that shown in FIG. 7 of Japanese Laid-Open Patent Publication No. 2004-5979. In the ferroelectric memory of FIG. 2, memory cells connected to adjacent word lines share a cell plate driving element, thus reducing the number of cell plate driving elements.

With the arrangement of FIG. 1, the same number of cell plate driving elements as the number of word lines are provided for each memory cell array, resulting in a large circuit area. The arrangement of FIG. 2 fails to provide a sufficient reduction in the circuit area.

SUMMARY

An example semiconductor memory device using cell plate lines may be capable of reducing the circuit area thereof.

Specifically, a semiconductor memory device according to an embodiment of the present invention includes a plurality of memory cell arrays each including a plurality of memory cells arranged in a matrix pattern, and a plurality of cell plate lines each being shared by the memory cell arrays, each of the cell plate lines corresponding to each of rows of the memory cells and each of the cell plate lines being connected to the memory cells of a corresponding one of the rows. Each of the memory cell arrays includes a plurality of word lines each of which corresponds to each of the rows of the memory cells in the memory cell array and each of the word lines is connected to the memory cells of a corresponding one of the rows. The number of the memory cells connected to each of the cell plate lines is larger than the number of the memory cells connected to one of the word lines corresponding to the each of the cell plate lines.

Thus, with each cell plate line being shared by a plurality of memory cell arrays, it is possible to significantly reduce the total number of elements provided for driving the cell plate lines, and to thereby reduce the circuit area.

Since no word line is shared by different memory cell arrays, it is possible to selectively activate only some of the memory cells connected to the same cell plate line. The cell plate capacitance of an inactive memory cell is significantly smaller than that of an active memory cell. Therefore, it is substantially unnecessary to increase the size of the cell plate driving element.

A semiconductor memory system according to another embodiment of the present invention includes a semiconductor memory device, and a memory controller for outputting a control signal for controlling the semiconductor memory device. The semiconductor memory device includes a plurality of memory blocks, and a column decoder for decoding a column address to generate a column selection signal specifying a column to be activated. Each of the memory blocks includes a plurality of memory cell arrays each including a plurality of memory cells arranged in a matrix pattern, and a plurality of cell plate lines each being shared by the memory cell arrays, each of the cell plate lines corresponding to each of rows of the memory cells and each of the cell plate lines being connected to the memory cells of a corresponding one of the rows. Each of the memory cell arrays includes a plurality of word lines each of which corresponds to each of the rows of the memory cells in the memory cell array and each of the word lines is connected to the memory cells of a corresponding one of the rows. The number of the memory cells connected to each of the cell plate lines is larger than the number of the memory cells connected to one of the word lines corresponding to the each of the cell plate lines. The column decoder generates the column selection signal so that the memory block(s) of which number is determined based on the control signal are activated while one of the cell plate lines is active.

According to an embodiment of the present invention, it is possible to significantly reduce the number of cell plate driving elements, and it is therefore possible to reduce the circuit area of a semiconductor memory device using cell plate lines.

DETAILED DESCRIPTION OF THE INVENTION

Embodiments of the present invention will now be described with reference to the drawings.

First Embodiment

Figure 3:
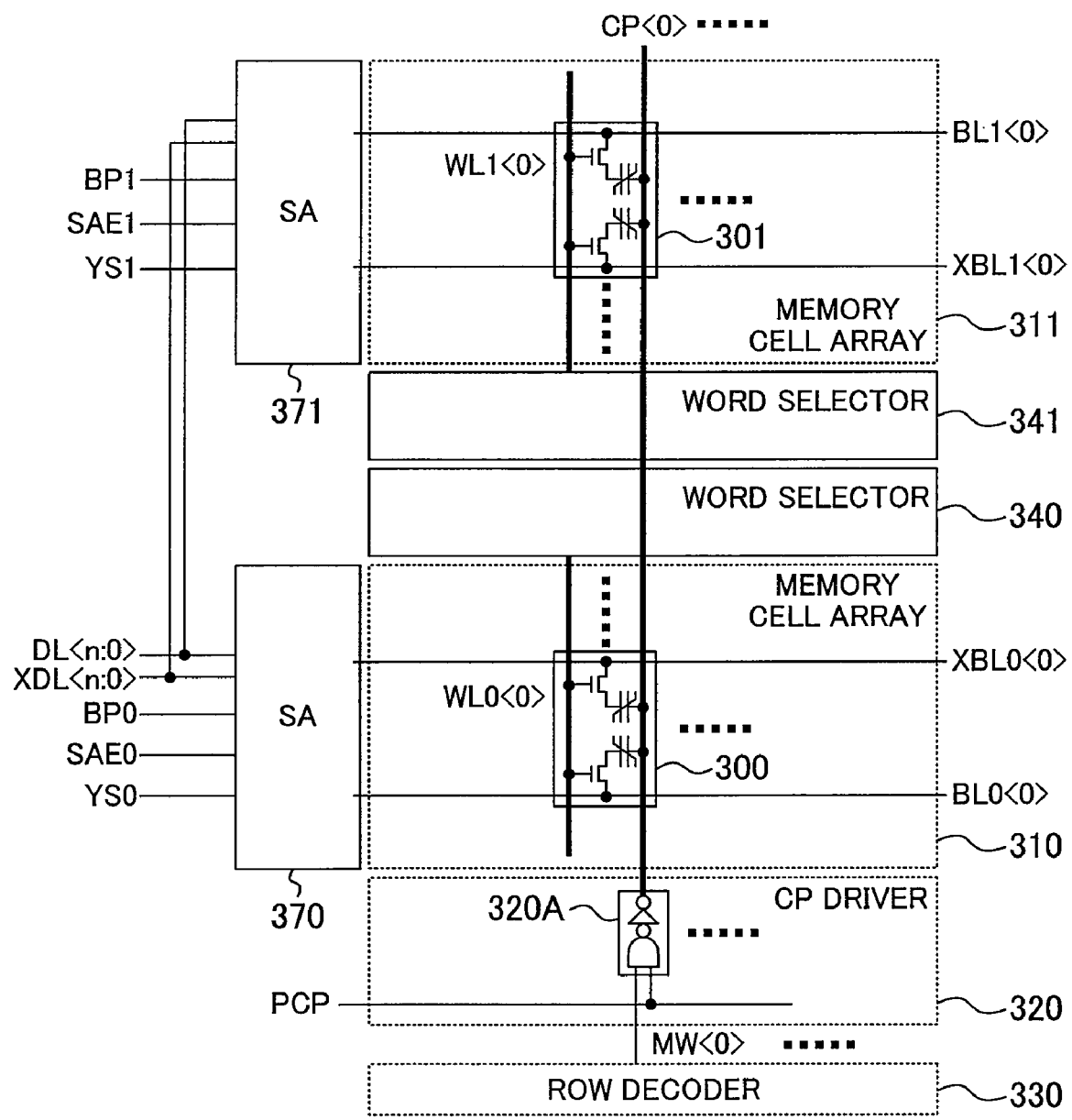
FIG. 3 is a block diagram showing a configuration of a semiconductor memory device according to a first embodiment of the present invention.

FIG. 3 is a block diagram showing a configuration of a semiconductor memory device according to a first embodiment of the present invention. The semiconductor memory device of FIG. 3 includes memory cell arrays 310 and 311, a cell plate driver (CP driver) 320, a row decoder 330, word selectors 340 and 341, and sense amplifiers 370 and 371.

The memory cell array 310 includes m rows by n columns (where m and n are integers) of memory cells 300 arranged in a matrix pattern, a word line WL0<0>, and bit lines BL0<0> and XBL0<0>. Similarly, the memory cell array 311 includes a plurality of memory cells 301 arranged in a matrix pattern, a word line WL1<0>, and bit lines BL1<0> and XBL1<0>. Each of the memory cells 300 and 301 is a 2 transistors 2 capacitors (2T2C) ferroelectric memory cell.

The memory cell array 310 includes one word line for each row of memory cells 300 and one bit line pair (e.g., the bit lines BL0<0> and XBL0<0>) for each column of memory cells 300. The memory cell array 311 includes one word line for each row of memory cells 301, and one bit line pair for each column of memory cells 301.

The semiconductor memory device of FIG. 3 includes a cell plate line CP<0> corresponding to one row of memory cells 300 and 301. The semiconductor memory device of FIG. 3 includes one cell plate line for each row of memory cells 300 and 301. The cell plate driver 320 includes a plurality of first cell plate driving elements 320A. Each of the cell plate driving elements 320A corresponds to one of the cell plate lines CP<0>, . . . , and drives the corresponding cell plate line.

The cell plate driving element 320A includes a NAND circuit, and an inverter circuit receiving the output signal of the NAND circuit. The NAND circuit receives a row decoder signal MW<0>, . . . , and the signal of the cell plate control line PCP. The sense amplifier 370 receives the signal of data lines DL<n:0> and XDL<n:0>, a bit line discharge control signal BP0, a sense amplifier activity control signal SAE0, and a column selection signal YS0, sent from a column decoder (not shown). The sense amplifier 371 receives the signal of the data lines DL<n:0> and XDL<n:0>, a bit line discharge signal BP1, a sense amplifier activity control signal SAE1, and a column selection signal YS1, sent from the column decoder. Herein, DL<n:0> represents DL<n>, DL<n−1>, . . . , DL<0>.

In each of the memory cell arrays 310 and 311 and the cell plate driver 320, a similar structure repeats in the direction of the bit line BL0<0>. In each of the memory cell arrays 310 and 311, a similar structure repeats in the direction of the word line WL0<0>.

The row decoder 330 generates a row decoder signal MW<0:m−1> from a given row address. The word selectors 340 and 341 activate the word lines WL0<0:m−1> and WL1<0:m−1> of the memory cell arrays 310 and 311 based on the row address and the information for selecting the memory cell array. The cell plate driver 320 drives the cell plate lines CP<0:m−1> based on the signal of the cell plate control line PCP and the row decoder signals MW<0:m−1>.

In the semiconductor memory device of FIG. 3, the number of memory cells connected to one word line is smaller than the number of memory cells connected to one cell plate line. In other words, the number of memory cells connected to one cell plate line is larger than the number of memory cells connected to one word line corresponding to the cell plate line. As shown in FIG. 3, the number of memory cells connected to the cell plate line CP<0> is, for example, twice the number of memory cells connected to the word line WL0<0> or WL1<0>.

Figure 1:
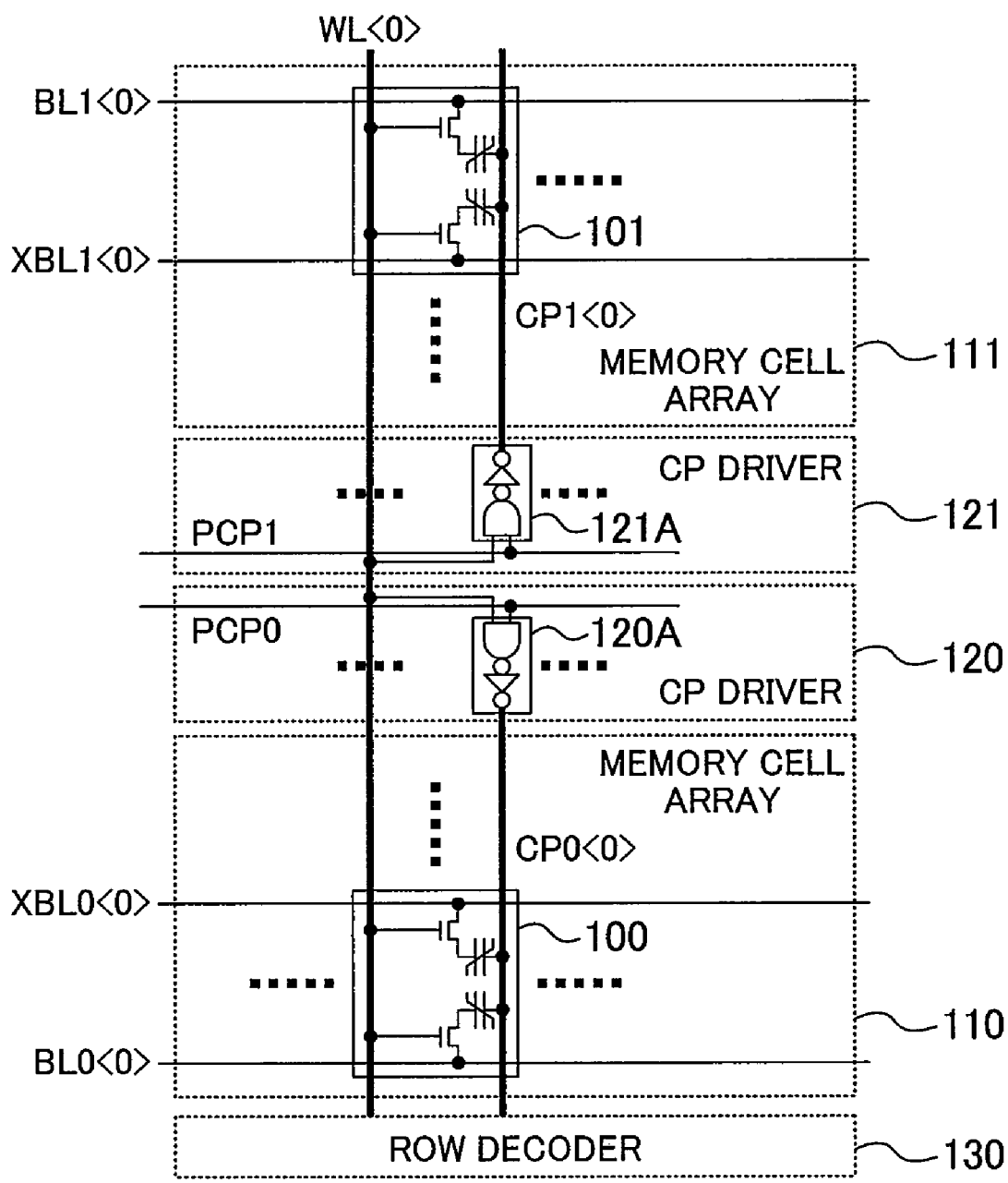
FIG. 1 is a block diagram showing an example of a block arrangement in a conventional ferroelectric memory.
Figure 2:
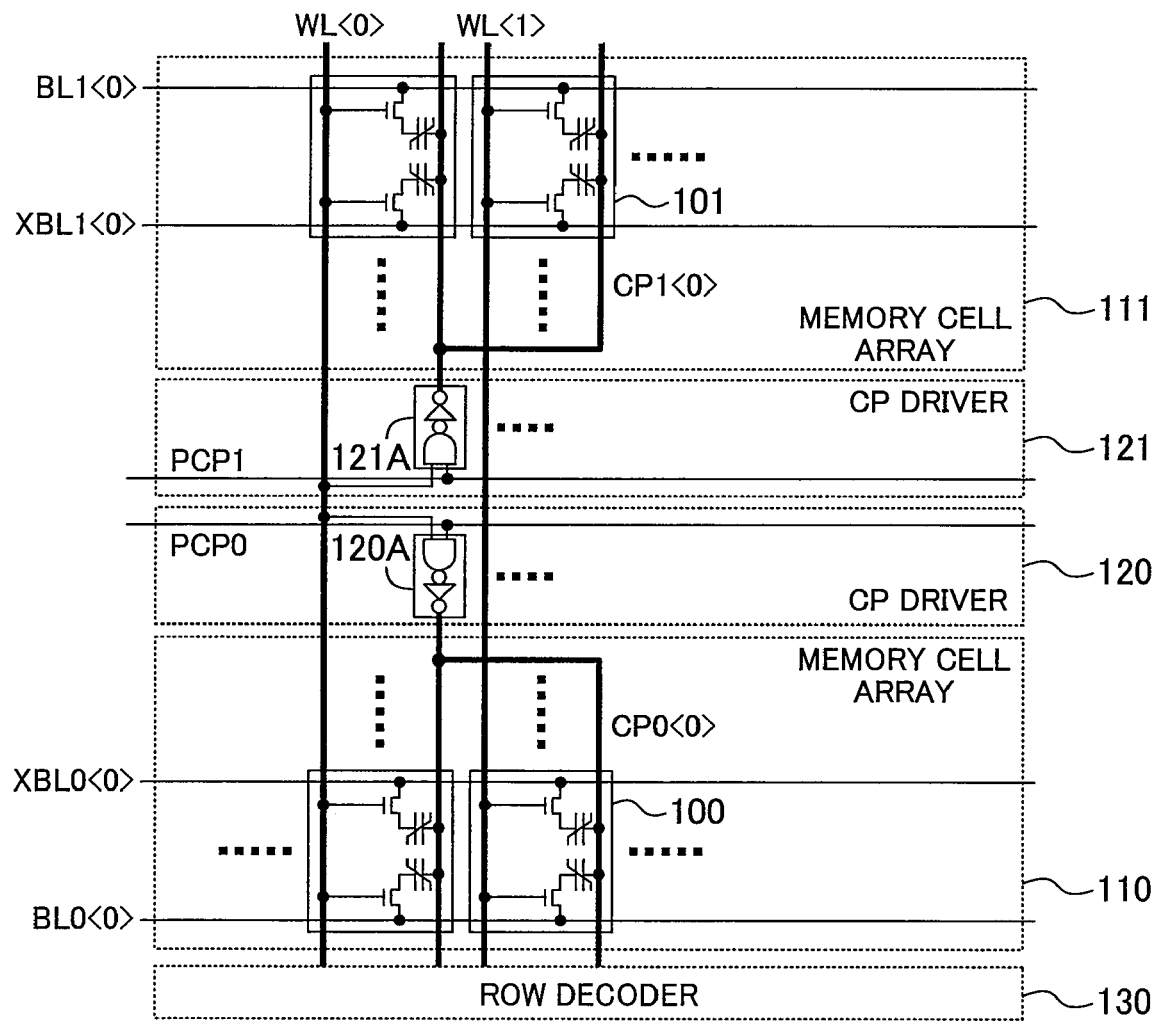
FIG. 2 is a block diagram showing another example of a block arrangement of a conventional ferroelectric memory.

The word selectors 340 and 341 are arranged corresponding to the memory cell arrays 310 and 311, respectively. With the memory of FIG. 1, the number of word selectors 340 and 341 is equal to the number of cell plate drivers. However, the word selectors 340 and 341 drive the load which is the gate capacitance of the selected memory cells, and the capacitance is significantly smaller than the cell plate capacitance. Thus, the area of the word selectors can be made smaller than that of the cell plate driver. Therefore, the circuit area of the semiconductor memory device of FIG. 3 can be made smaller than that of the semiconductor memory device of FIG. 1. While FIG. 3 shows a case where there are two memory cell arrays, there may be more memory cell arrays in the word line direction, in which case there is obtained a greater effect of reducing the circuit area.

Figure 4:
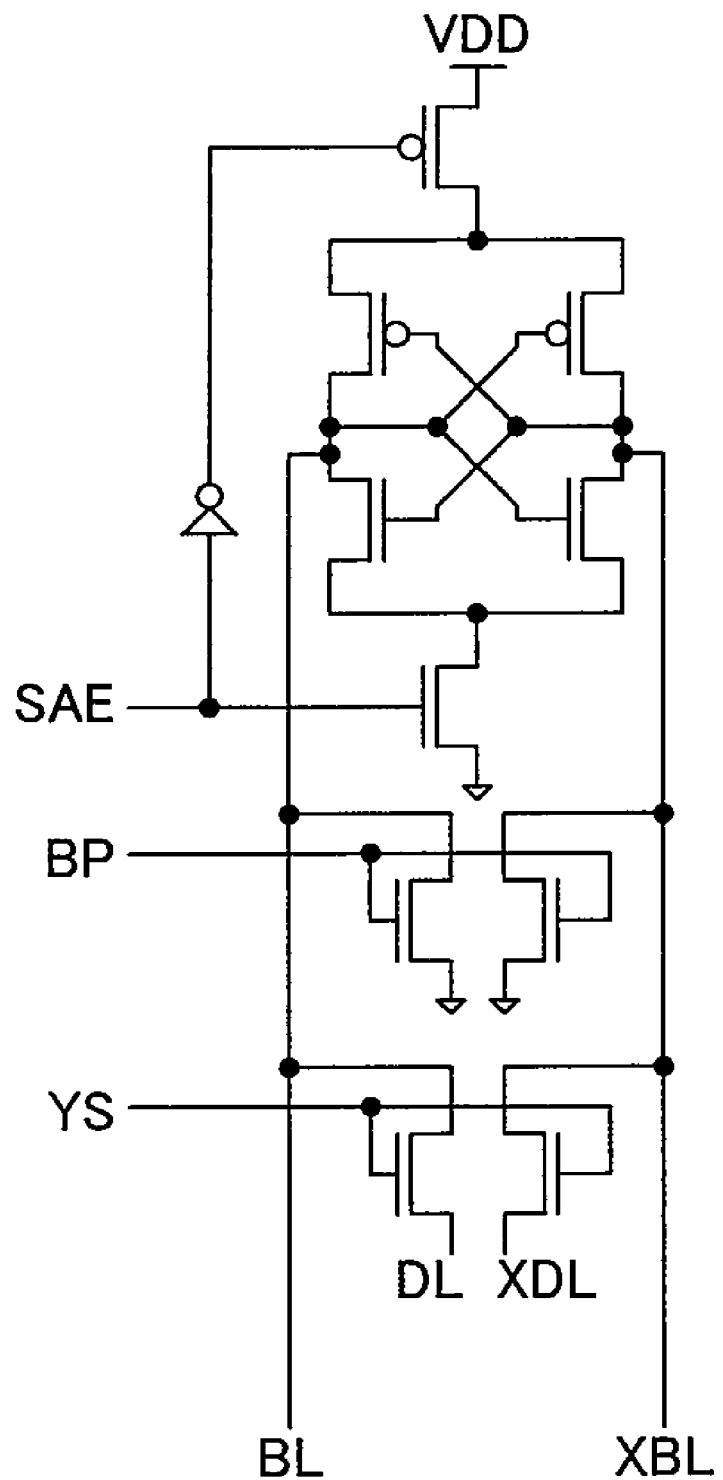
FIG. 4 is a circuit diagram showing an example of a configuration of a sense amplifier of FIG. 3.

FIG. 4 is a circuit diagram showing an example of a configuration of the sense amplifiers 370 and 371 of FIG. 3. A bit line discharge signal BP, a sense amplifier activity control signal SAE, a column selection signal YS, bit lines BL and XBL, and data lines DL and XDL of FIG. 4 correspond respectively to the bit line discharge signal BP0, the sense amplifier activity control signal SAE0, the column selection signal YS0, the bit lines BL0<0> and XBL0<0>, and the data lines DL<n:0> and XDL<n:0>, . . . , of FIG. 3.

The sense amplifier of FIG. 4 is inactive while the sense amplifier activity control signal SAE is at the L level (low potential), and amplifies the potential difference between the bit lines BL and XBL when the sense amplifier activity control signal SAE is at the H level (high potential). The sense amplifier of FIG. 4 includes bit line discharge transistors. The bit line discharge transistors are inactive when the bit line discharge signal BP is at the L level, and discharge the potential of the bit lines BL and XBL to the ground level when the bit line discharge signal BP is at the H level. When the column selection signal YS is at the H level, the sense amplifier of FIG. 4 activates a column corresponding to the column selection signal YS, i.e., transfers data between the bit lines BL and XBL and the data lines DL and XDL.

Figure 5:
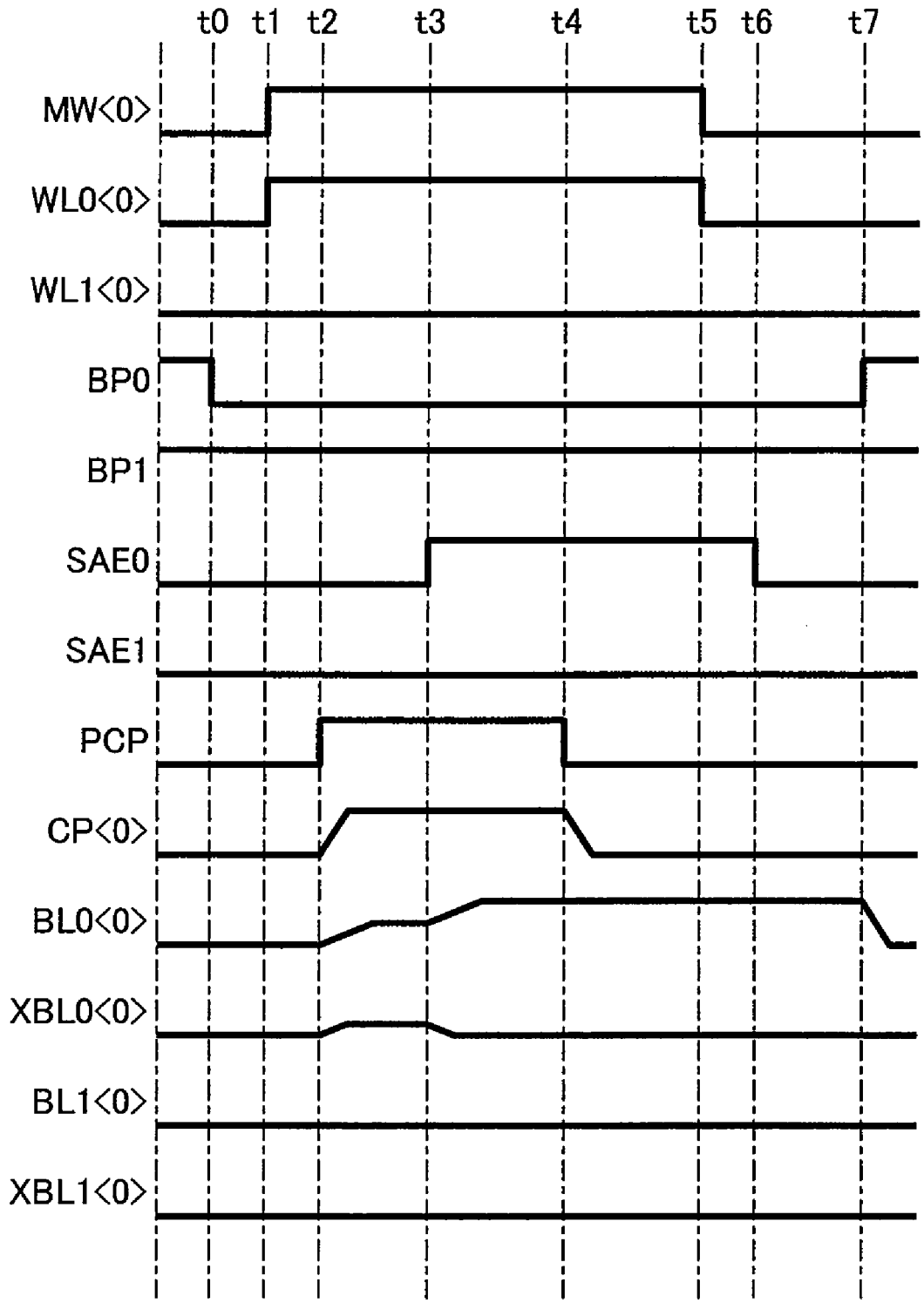
FIG. 5 is a timing diagram showing a read operation by the semiconductor memory device of FIG. 3.

FIG. 5 is a timing diagram showing a read operation by the semiconductor memory device of FIG. 3. At time t0, the bit line discharge signal BP0 is brought to the L level, thereby stopping the bit line discharge. At time t1, the word line WL0<0> is brought to the selected state by the row decoder signal MW<0>.

At time t2, the cell plate control line PCP is brought to the H level. Thus, the cell plate line CP<0> transitions to the H level, thereby producing a potential difference between the bit lines BL0<0> and XBL0<0>. At time t3, the sense amplifier activity control signal SAE0 is brought to the H level, thereby amplifying the potential difference between the bit lines BL0<0> and XBL0<0>, and re-writing L data to memory cells connected to the bit line XBL0<0>.

At time t4, the cell plate control line PCP is brought to the L level. The cell plate line CP<0> transitions to the L level, thereby re-writing H data to memory cells connected to the bit line BL0<0>. At time t5, the row decoder signal MW<0> and the word line WL0<0> are brought to the non-selected state.

At time t6, the sense amplifier activity control signal SAE0 is brought to the L level, thereby stopping the sense amplifier. At time t7, the bit line discharge signal BP0 is brought to the H level, thereby discharging the bit lines, and thus completing the read operation.

Second Embodiment

Figure 6:
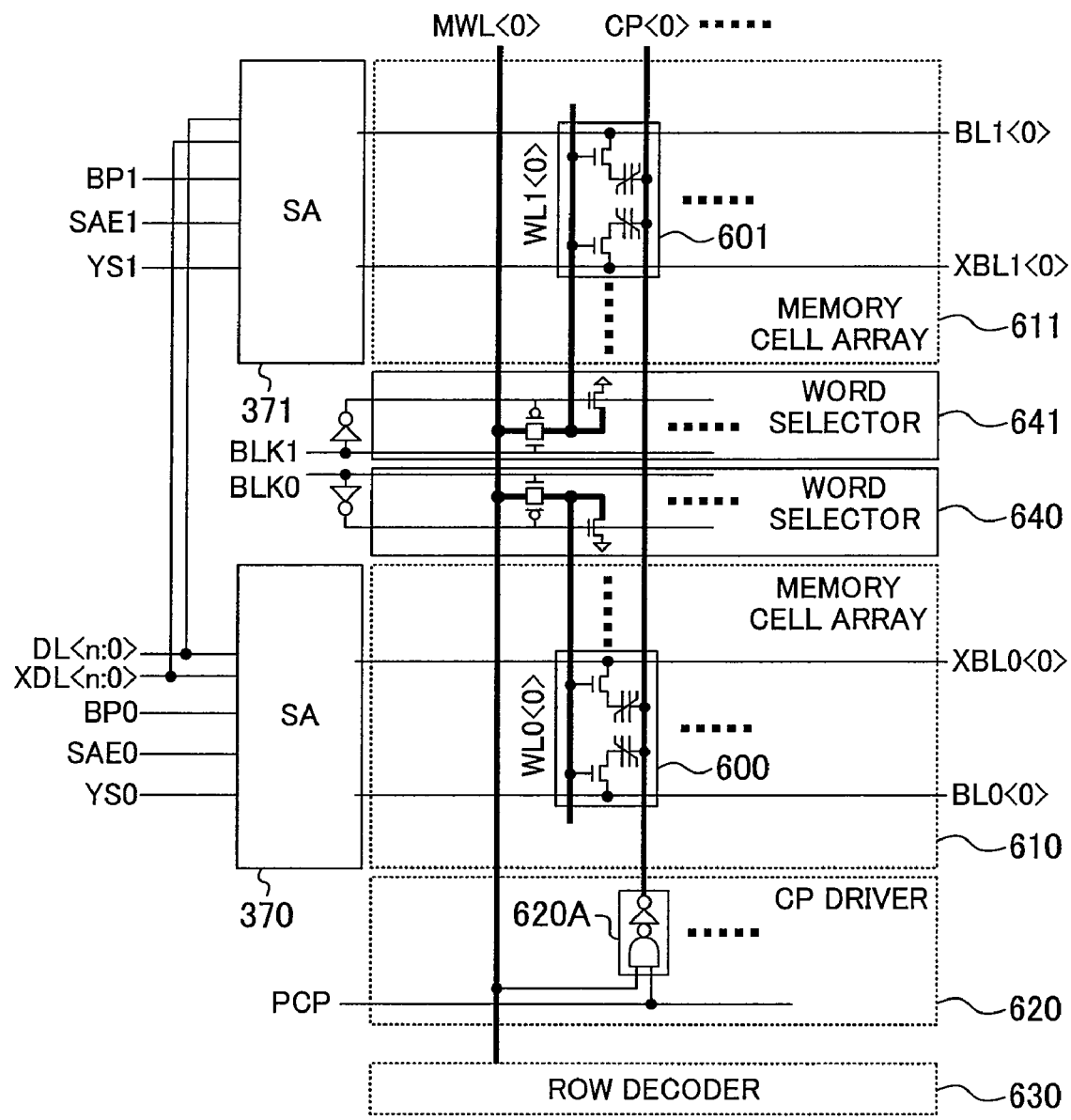
FIG. 6 is a block diagram showing a configuration of a semiconductor memory device according to a second embodiment of the present invention.

FIG. 6 is a block diagram showing a configuration of a semiconductor memory device according to a second embodiment of the present invention. The semiconductor memory device of FIG. 6 includes memory cell arrays 610 and 611, a cell plate driver 620, a row decoder 630, word selectors 640 and 641, and the sense amplifiers 370 and 371. The memory cell arrays 610 and 611 and the row decoder 630 are substantially the same as the memory cell arrays 310 and 311 and the row decoder 330 of FIG. 3.

The semiconductor memory device of FIG. 6 further includes a main word line MWL<0>, corresponding to the word lines WL0<0> and WL1<0>, for transferring the row decoder signal MW<0>. The semiconductor memory device of FIG. 6 includes one main word line for each row of memory cells 600 and 601. The main word lines MWL<0>, . . . , are driven by the corresponding row decoder signals MW<0>, . . . .

The memory cell array 610 includes m rows by n columns (where m and n are integers) of memory cells 600 arranged in a matrix pattern. Similarly, the memory cell array 611 includes memory cells 601 arranged in a matrix pattern. Each of the memory cells 600 and 601 is a ferroelectric memory cell similar to the memory cells 300 and 301 of FIG. 3.

The cell plate driver 620 includes a plurality of first cell plate driving elements 620A each driving the corresponding one of the cell plate lines CP<0>, . . . . The cell plate driving element 620A includes a NAND circuit, and an inverter circuit receiving the output signal of the NAND circuit. The NAND circuit receives the signal of the main word lines MWL<0>, . . . , and the signal of the cell plate control line PCP.

The word selector 640 includes, as a control element, a transfer gate connected between the main word line MWL<0> and the word line WL0<0>. The word selector 641 includes, as a control element, a transfer gate connected between the main word line MWL<0> and the word line WL1<0>. The word selectors 640 and 641 similarly include transfer gates between other main word lines and the corresponding word lines. In each of the memory cell arrays 610 and 611, the cell plate driver 620 and the word selectors 640 and 641, a similar structure repeats in the direction of the bit line BL0<0>.

The word selectors 640 and 641 receive row address information via the main word line MWL<0>, . . . , and also use memory array selection signals BLK0 and BLK1 containing column address information. Therefore, the word selectors 640 and 641 can be formed primarily by transfer gates, whereby it is possible to reduce the circuit area.

Moreover, since the main word line for transferring the row decoder signal is shared by the word selectors 640 and 641 and the cell plate driver 620, it is possible to reduce the row decoding circuit.

Figure 7:
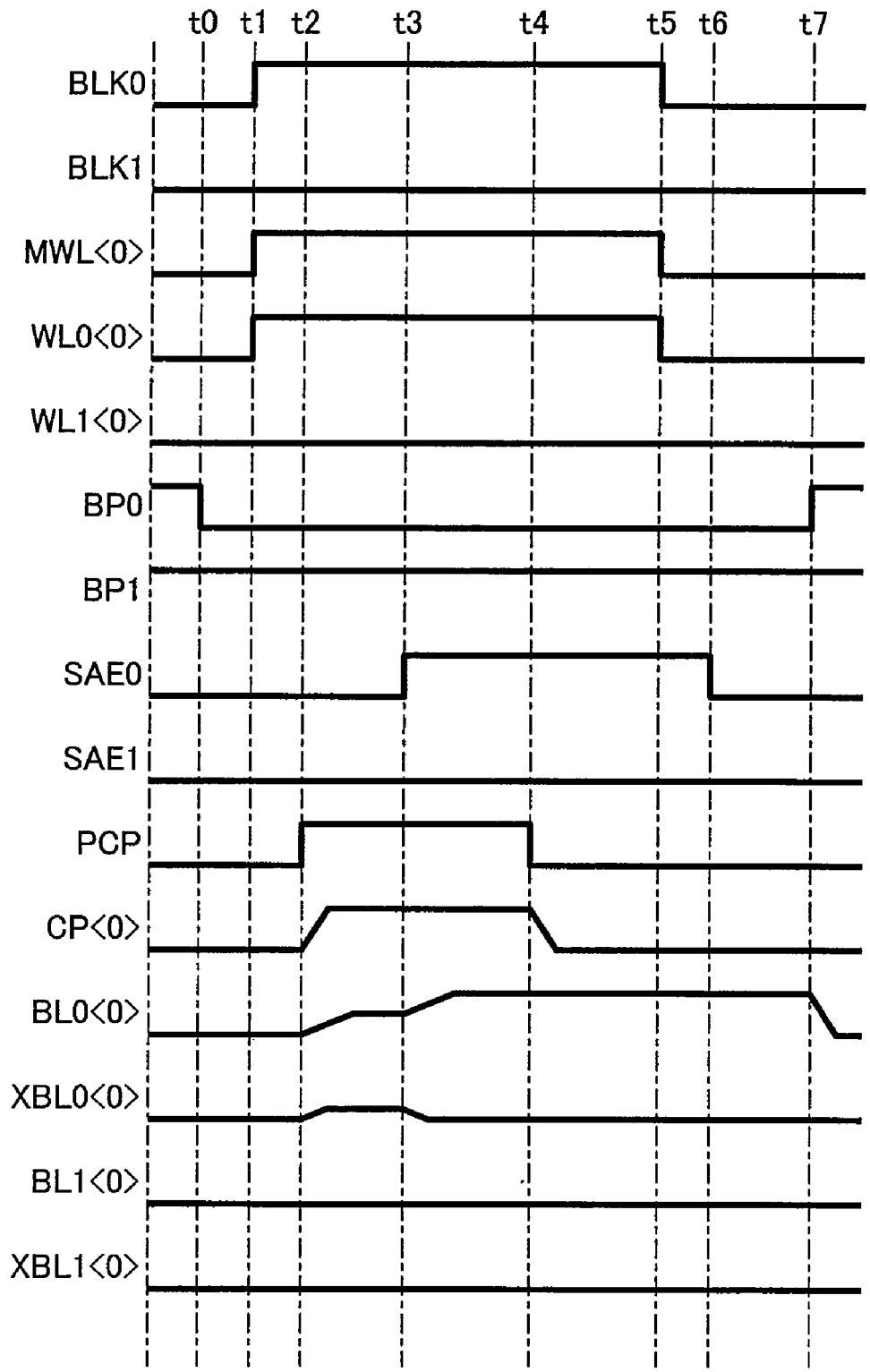
FIG. 7 is a timing diagram showing a read operation by the semiconductor memory device of FIG. 6.

FIG. 7 is a timing diagram showing a read operation by the semiconductor memory device of FIG. 6. At time t0, the bit line discharge signal BP0 is brought to the L level, thereby stopping the bit line discharge. At time t1, the main word line MWL<0> is brought to the selected state. At this time, the memory array selection signal BLK0 is brought to the H level, and the word line WL0<0> is brought to the selected state. The operation from time t2 to time t4 is similar to that shown in FIG. 5, and will not be further described below.

At time t5, the main word line MWL<0> is brought to the non-selected state, and the memory array selection signal BLK0 is brought to the L level. Thus, the word line WL0<0> is brought to the non-selected state. The operation from time t6 to time t7 is also similar to that shown in FIG. 5, and will not be further described below.

Third Embodiment

Figure 8:
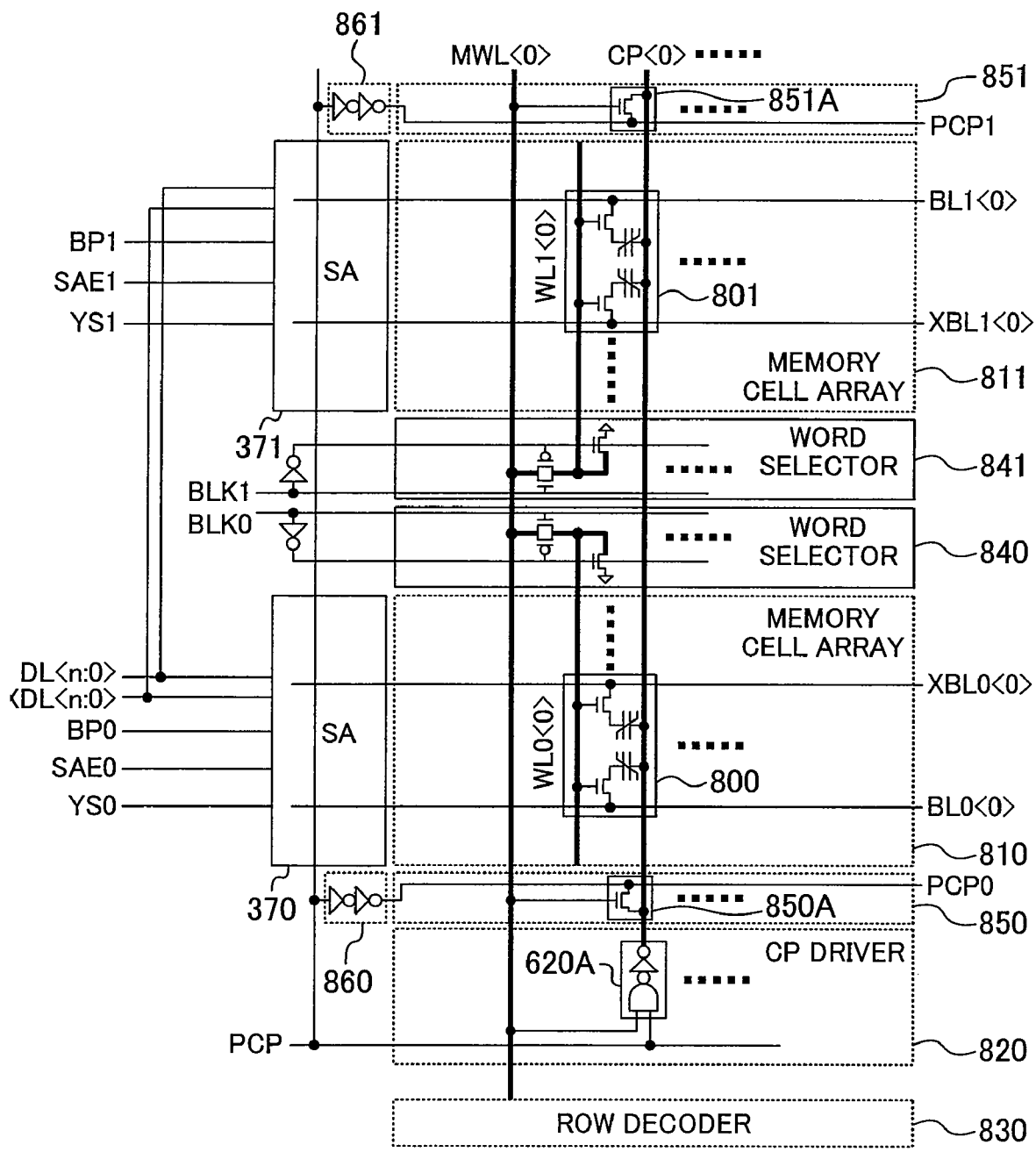
FIG. 8 is a block diagram showing a configuration of a semiconductor memory device according to a third embodiment of the present invention.

FIG. 8 is a block diagram showing a configuration of a semiconductor memory device according to a third embodiment of the present invention. The semiconductor memory device of FIG. 8 further includes cell plate drivers 850 and 851 and cell plate line auxiliary driving buffers 860 and 861, as compared with the semiconductor memory device of FIG. 6. The semiconductor memory device of FIG. 8 includes memory cell arrays 810 and 811, a cell plate driver 820, a row decoder 830, and word selectors 840 and 841, which are similar to the memory cell arrays 610 and 611, the cell plate driver 620, the row decoder 630, and the word selectors 640 and 641 shown in FIG. 6.

The semiconductor memory device of FIG. 8 includes at least one cell plate driver 850 or 851 for each memory cell array, in addition to the cell plate driver 820. The cell plate driver 850 includes a plurality of transistors (second cell plate driving elements) 850A corresponding to the respective cell plate lines. The cell plate driver 851 also includes a plurality of transistors (second cell plate driving elements) 851A corresponding to the respective cell plate lines.

In other words, there are a plurality of dispersed transistors corresponding to one cell plate line CP<0>, and these transistors are connected to one cell plate line CP<0>. Thus, even where the memory cell array is elongated in the word line direction, the cell plate line can be driven at a high speed.

Figure 9:
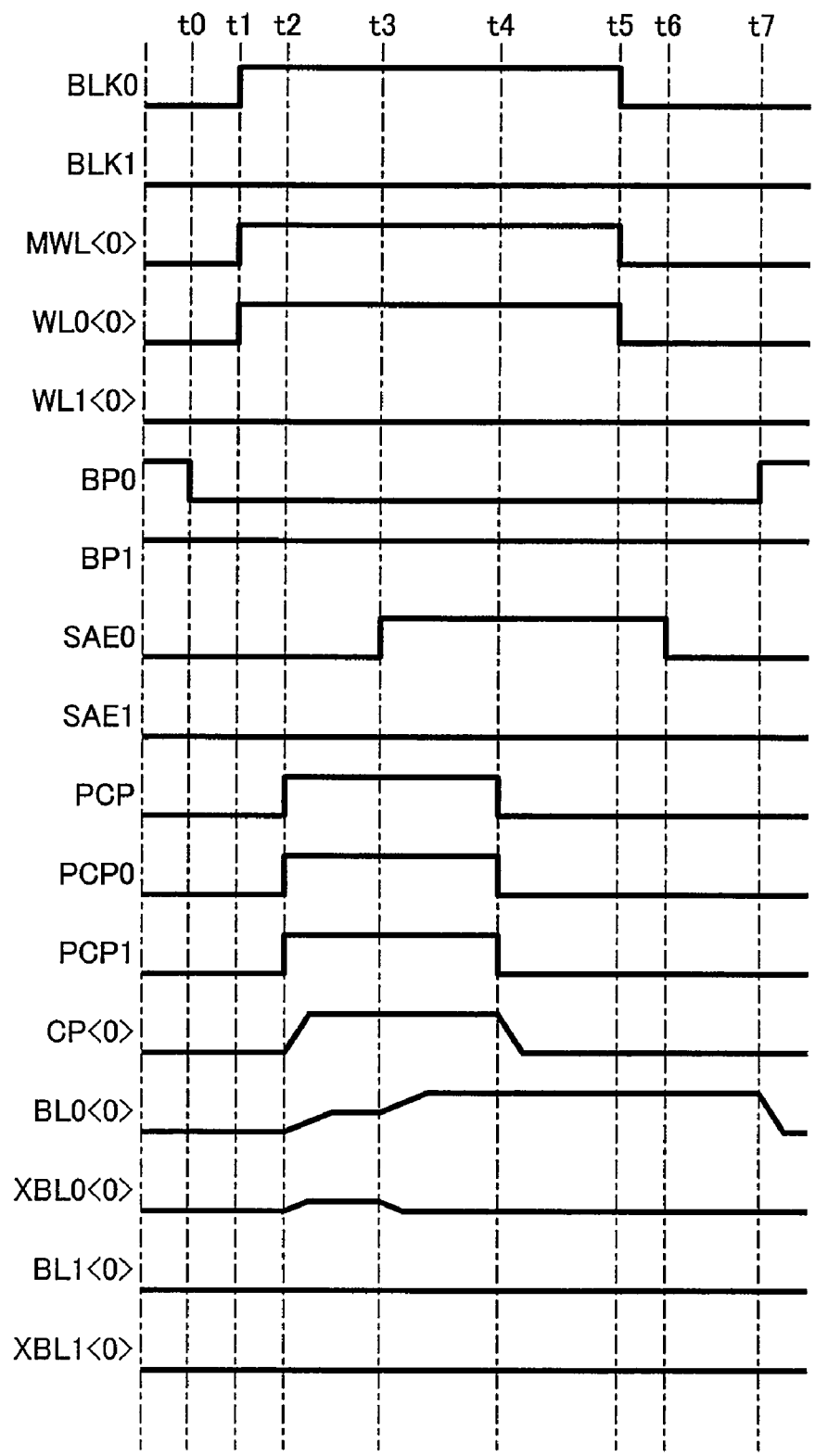
FIG. 9 is a timing diagram showing a read operation by the semiconductor memory device of FIG. 8.

FIG. 9 is a timing diagram showing a read operation by the semiconductor memory device of FIG. 8. At time t0, the bit line discharge signal BP0 is brought to the L level, thereby stopping the bit line discharge. At time t1, the main word line MWL<0> is brought to the selected state. Then, the cell plate drivers 850 and 851 are activated. The memory array selection signal BLK0 is brought to the H level, and the word line WL0<0> is brought to the selected state. At time t2, the cell plate control line PCP is brought to the H level. Thus, the cell plate control lines PCP0 and PCP1 are brought to the H level, and the cell plate line CP<0> transitions to the H level, thereby producing a potential difference between the bit lines BL0<0> and XBL0<0>. The operation at time t3 is similar to that shown in FIG. 5, and will not be further described below.

At time t4, the cell plate control line PCP is brought to the L level. The cell plate control lines PCP0 and PCP1 are brought to the L level, and the cell plate line CP<0> transitions to the L level, thereby re-writing H data to memory cells connected to the bit line BL0<0>. At time t5, the main word line MWL<0> is brought to the non-selected state, thereby stopping the cell plate drivers 850 and 851. The word line WL0<0> is brought to the non-selected state by bringing the memory array selection signal BLK0 to the L level. The operation from time t6 to time t7 is also similar to that shown in FIG. 5, and will not be further described below.

Figure 10:
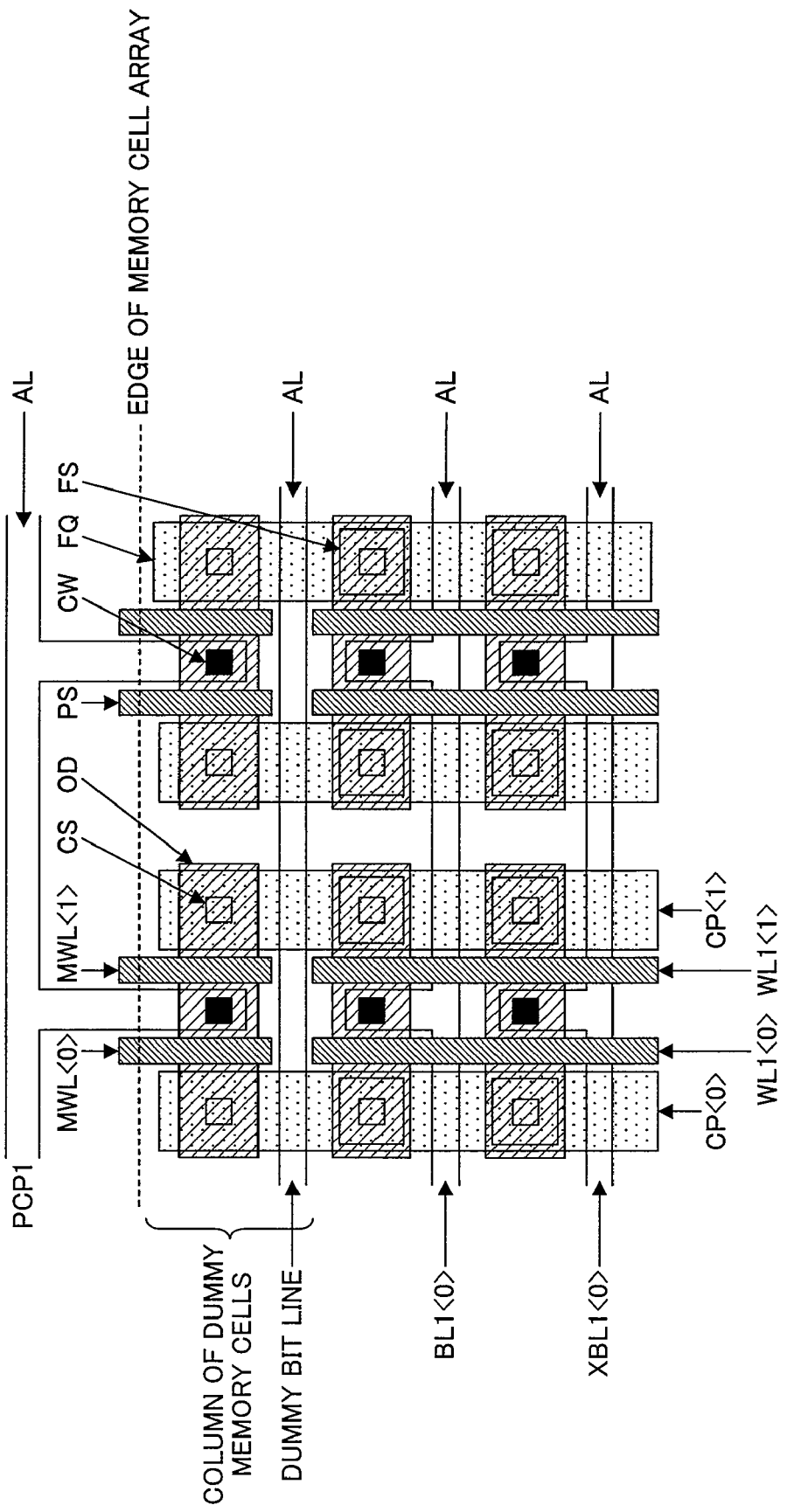
FIG. 10 shows a layout of the memory cell array and the cell plate driver of FIG. 8.

FIG. 10 shows a layout of the memory cell array 811 and the cell plate driver 851 of FIG. 8. FIG. 10 shows an active region OD, a polysilicon gate wire PS, a memory cell capacitor element FS, a cell plate line FQ, a bit line AL, a contact CW for the connection between the active region OD and the bit line AL, and a contact CS for the connection between the active region OD and the memory cell capacitor element FS or between the active region OD and the cell plate line FQ.

It is effective to provide dummy memory cells along the edge of the memory cell array, which are not used for storing data but have substantially the same shape as the other memory cells, in order to maintain the memory cell characteristics. However, the area of the dummy memory cells is often an extra region that is not utilized effectively. In the present embodiment, the memory cell array 811 includes a dummy memory cell area having dummy memory cells and dummy bit lines. The gates of the transistors of the dummy memory cells are connected to the main word lines MWL<0>, MWL<1>, . . . , with the contact CS connecting the active region OD to the cell plate line FQ. Thus, the area of dummy memory cells can be utilized as the cell plate driver 851. In other words, it is possible to add the cell plate driver 851 without increasing the circuit area.

Figure 11:
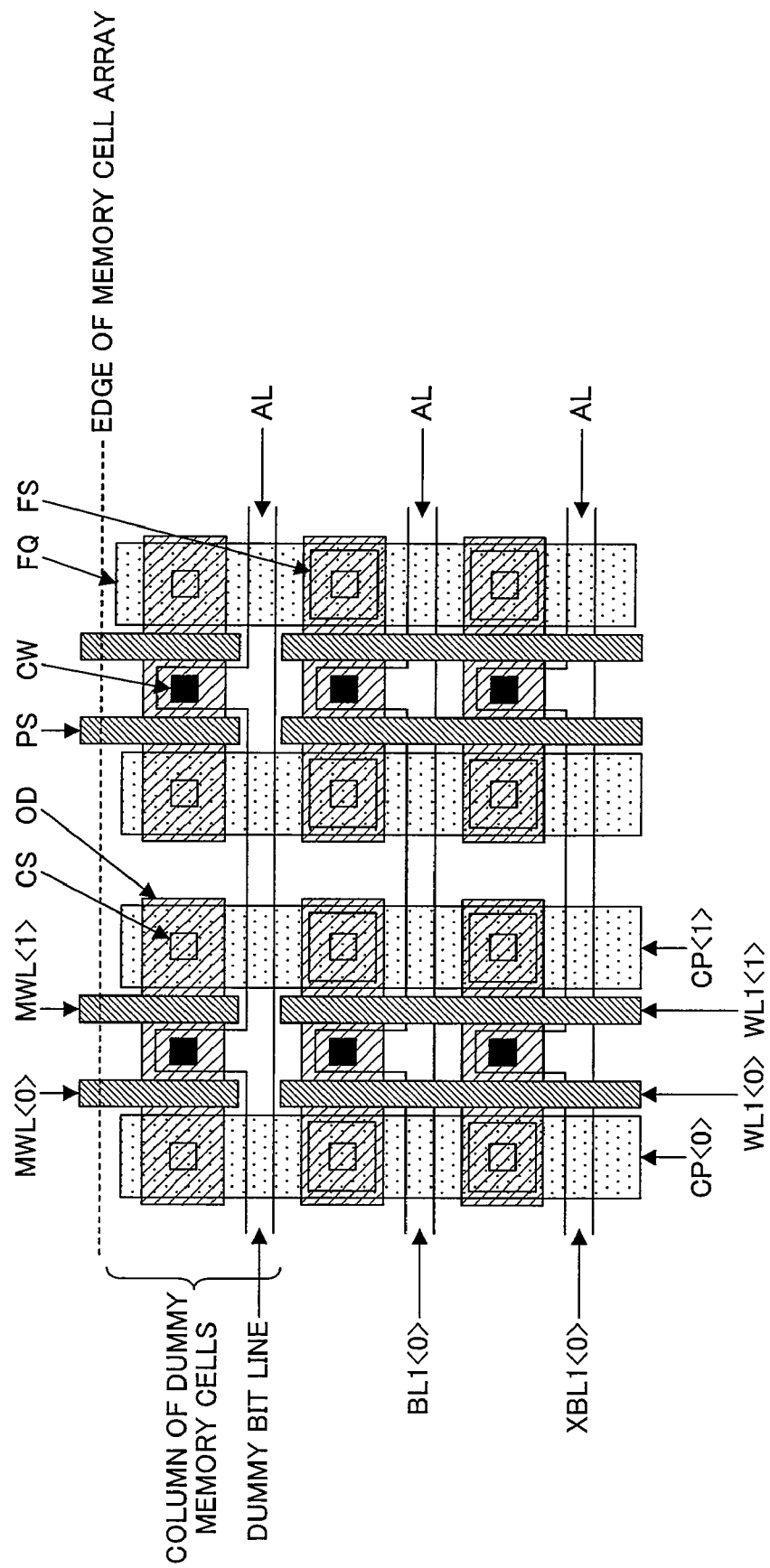
FIG. 11 shows a variation of the layout of FIG. 10.

FIG. 11 shows a variation of the layout of FIG. 10. In FIG. 11, the dummy bit line of the dummy memory cell is used as a wire for the cell plate control line PCP0 or PCP1. Thus, it is possible to further reduce the circuit area from that of FIG. 10.

Figure 12:
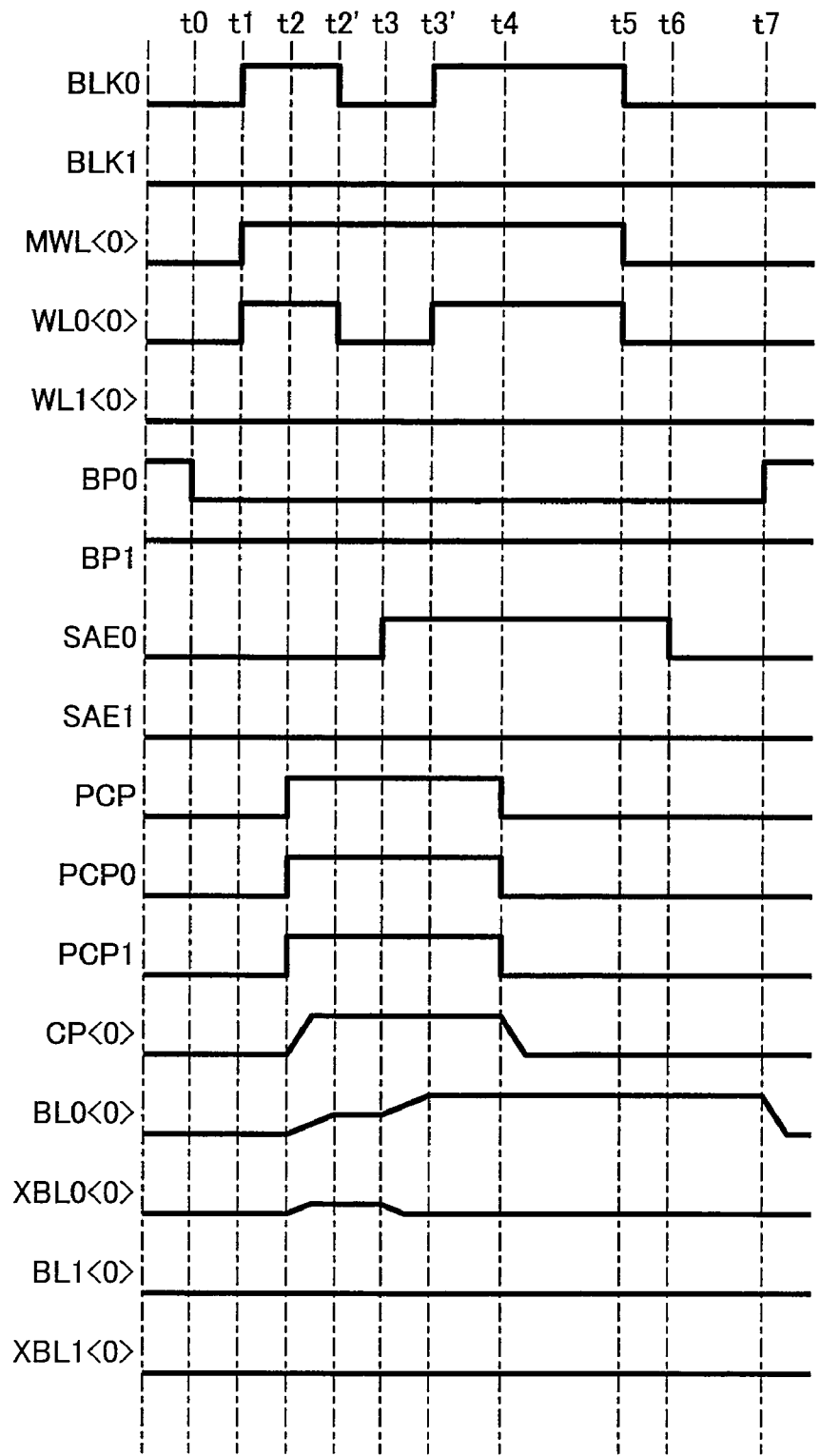
FIG. 12 is a timing diagram showing a variation of a read operation by the semiconductor memory device of FIG. 8.

FIG. 12 is a timing diagram showing a variation of a read operation by the semiconductor memory device of FIG. 8. The operation from time t0 to time t2 is similar to that shown in FIG. 9, and will not be further described below. At time t2', the memory array selection signal BLK0 is brought to the L level, and the word line WL0<0> is brought to the non-selected state.

At time t3, the sense amplifier activity control signal SAE0 is brought to the H level, thereby amplifying the potential difference between the bit lines BL0<0> and XBL0<0>. At time t3', the memory array selection signal BLK0 is brought to the H level. Then, the word line WL0<0> is brought to the selected state, thereby re-writing L data to memory cells connected to the bit line XBL0<0>. The operation from time t4 to time t7 is also similar to that shown in FIG. 9, and will not be further described below.

Figure 13:
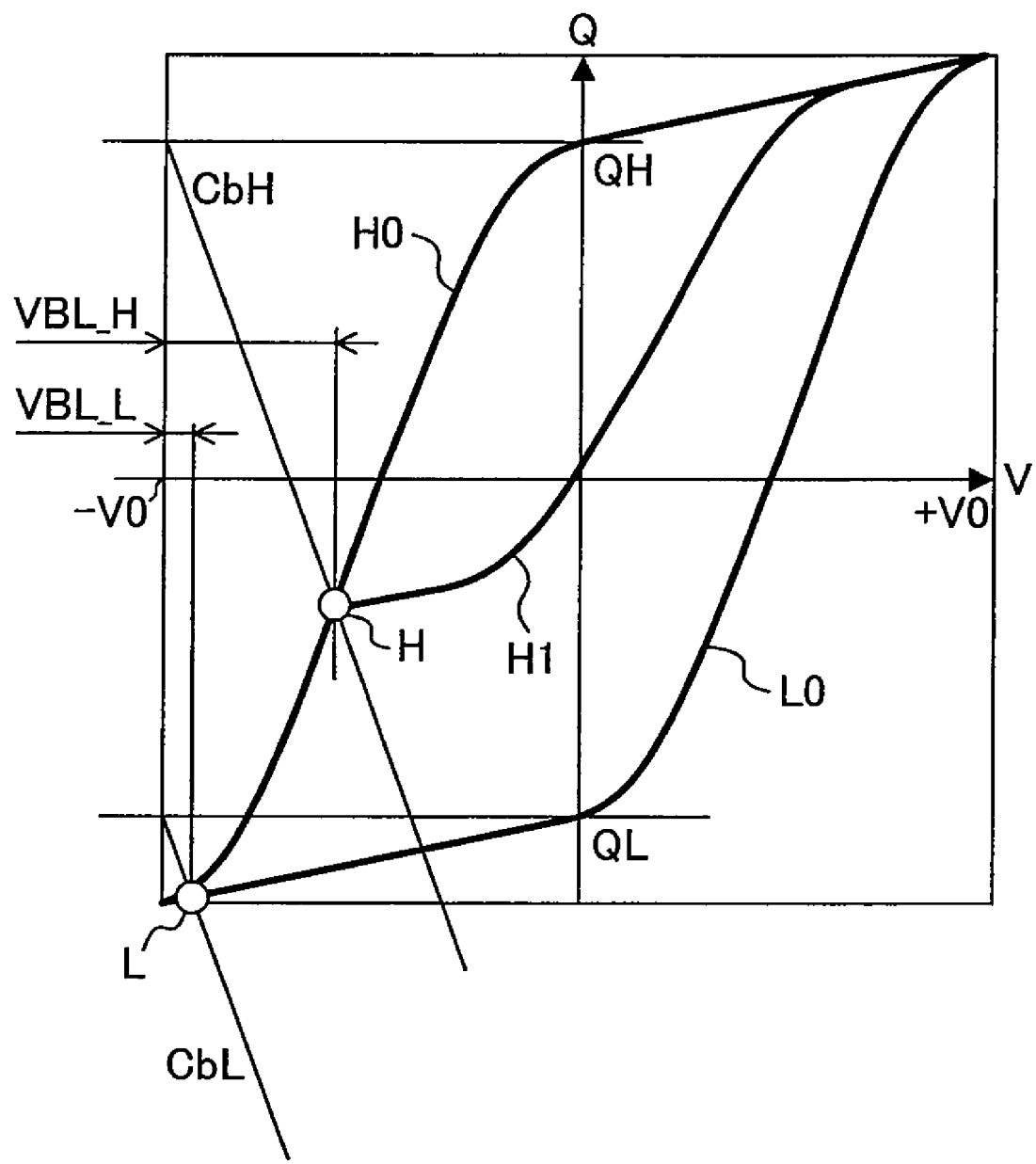
FIG. 13 is a graph showing the polarization characteristics of a ferroelectric capacitor of a memory cell in a case where the semiconductor memory device of FIG. 8 is operated as shown in FIG. 12.

FIG. 13 is a graph showing the polarization characteristics of a ferroelectric capacitor of a memory cell in a case where the semiconductor memory device of FIG. 8 is operated as shown in FIG. 12. The horizontal axis of FIG. 13 represents the voltage V of the ferroelectric capacitor, and the vertical axis thereof represents the charge Q. The relationship between the charge and the voltage of the ferroelectric capacitor is represented by curves H0, H1 and L0.

The bit line potential VBL_H at time t3 of FIG. 12 can be obtained from the intersection H between the straight line CbH that passes through the point (−V0, QH) in FIG. 13 and has a gradient (dQ/dV) equal to the bit line capacitance Cb and the curve H0. Herein, the voltage V0 is the cell plate voltage. The bit line potential VBL_L at time t3 of FIG. 12 can be obtained from the intersection L between the straight line CbL that passes through the point (−V0, QL) in FIG. 13 and has a gradient (dQ/dV) equal to the bit line capacitance Cb and a curve L0.

As described above, the polarization of the ferroelectric capacitor storing H data at time t3 of FIG. 12 is represented by the point H being the intersection between the straight line CbH and the curve H0. The bit line connected to this ferroelectric capacitor has a potential BL_H. The polarization of the ferroelectric capacitor storing L data is represented by the point L being the intersection between the straight line CbL and the curve L0. The potential of the bit line connected to this ferroelectric capacitor is BL_L.

If the word line WL0<0> is in the selected state and the sense amplifier is activated at time t3 to amplify the bit line voltage, the point representing the polarization of the ferroelectric capacitor storing H data moves along the curve H1 and the point representing the polarization of the ferroelectric capacitor storing L data moves along the curve L0. Then, the load capacitance of the bit line to which the ferroelectric capacitor storing H data is connected is larger than that of the bit line to which the ferroelectric capacitor storing L data is connected, and this causes noise for the amplification operation.

In the case of FIG. 12, when the sense amplifier 370 is activated to start the amplification of the potential difference between bit lines (time t3), the word line WL0<0> is at the non-selected level, whereby the transistor of the memory cell from which a read operation is being performed is in a non-conductive state. Thus, it is possible to remove the noise in the amplification operation, and to realize a stable operation.

Fourth Embodiment

Figure 14:
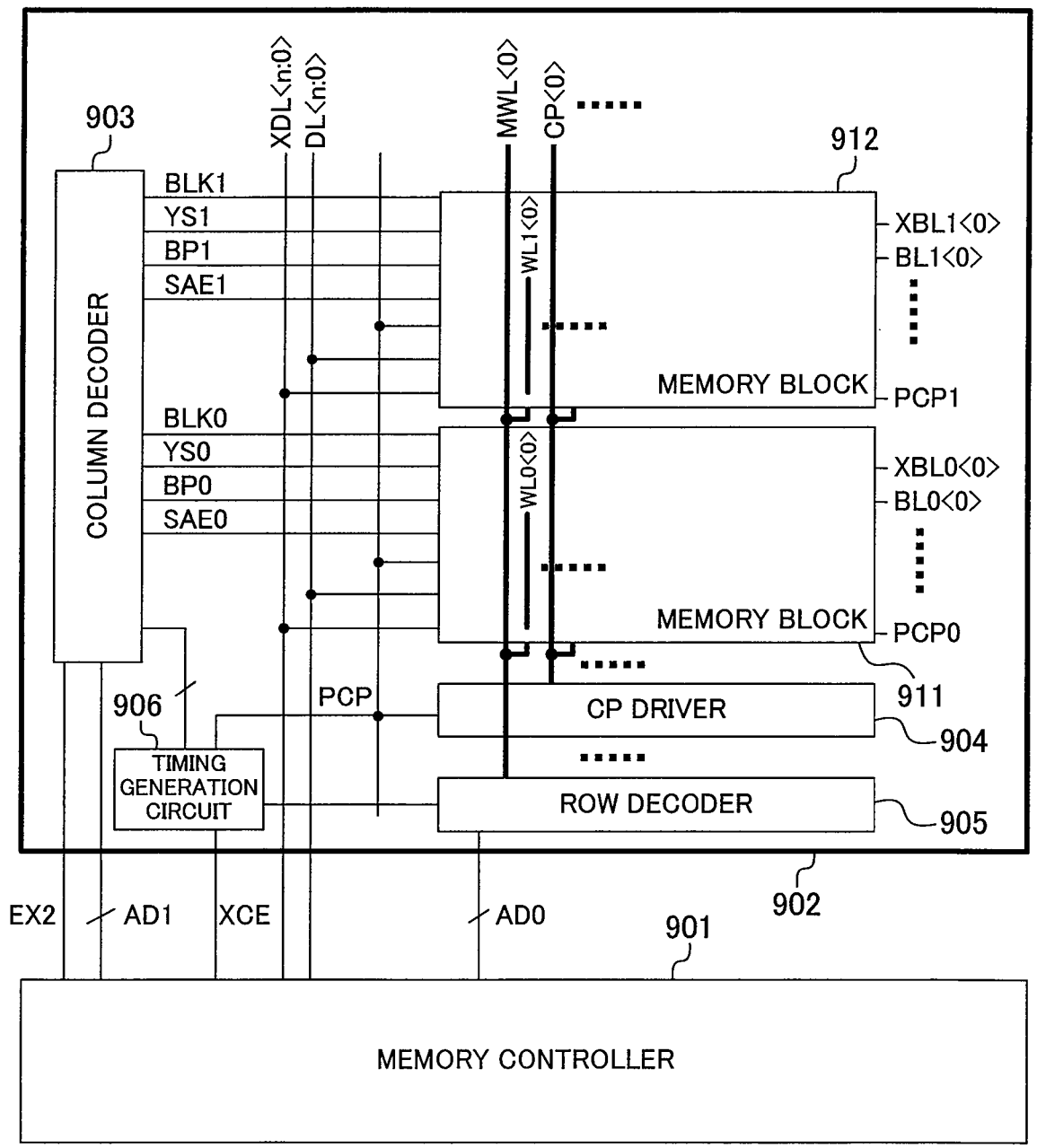
FIG. 14 is a block diagram showing a configuration of a semiconductor memory system according to a fourth embodiment of the present invention.

FIG. 14 is a block diagram showing a configuration of a semiconductor memory system according to a fourth embodiment of the present invention. The semiconductor memory system of FIG. 14 includes a memory controller 901, and a semiconductor memory device 902. The semiconductor memory device 902 includes a column decoder 903, a cell plate driver 904, a row decoder 905, a timing generation circuit 906, and memory blocks 911 and 912.

The memory controller 901 outputs a chip selection signal XCE to the timing generation circuit 906, an address signal AD0 to the row decoder 905, and an address signal AD1 and the data transfer rate control signal EX2 to the column decoder 903. The memory controller 901 is connected to the memory blocks 911 and 912 via the data lines DL<n:0> and XDL<n:0>.

Figure 15:
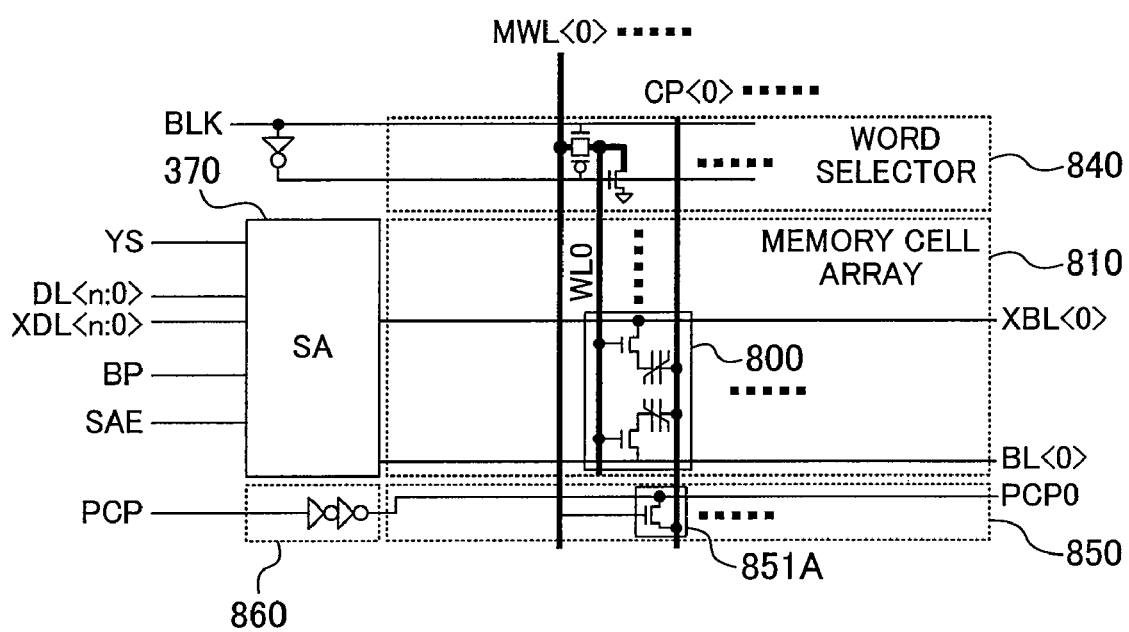
FIG. 15 is a block diagram showing a configuration of each memory block of FIG. 14.

FIG. 15 is a block diagram showing a configuration of each of the memory blocks 911 and 912 of FIG. 14. As shown in FIG. 15, the memory block 911, 912 includes the memory cell array 810, the word selector 840, the sense amplifier 370, the cell plate driver 850, and the cell plate line auxiliary driving buffer 860. These elements of the memory block 911, 912 have already been described with reference to FIG. 8, etc., and will not be further described below.

The memory array selection signal BLK of FIG. 15 corresponds to the memory array selection signal BLK0 or BLK1. The column selection signal YS of FIG. 15 corresponds to the column selection signal YS0 or YS1. The bit line discharge signal BP of FIG. 15 corresponds to the bit line discharge signal BP0 or BP1. The sense amplifier activity control signal SAE of FIG. 15 corresponds to the sense amplifier activity control signal SAE0 or SAE1.

Figure 16:
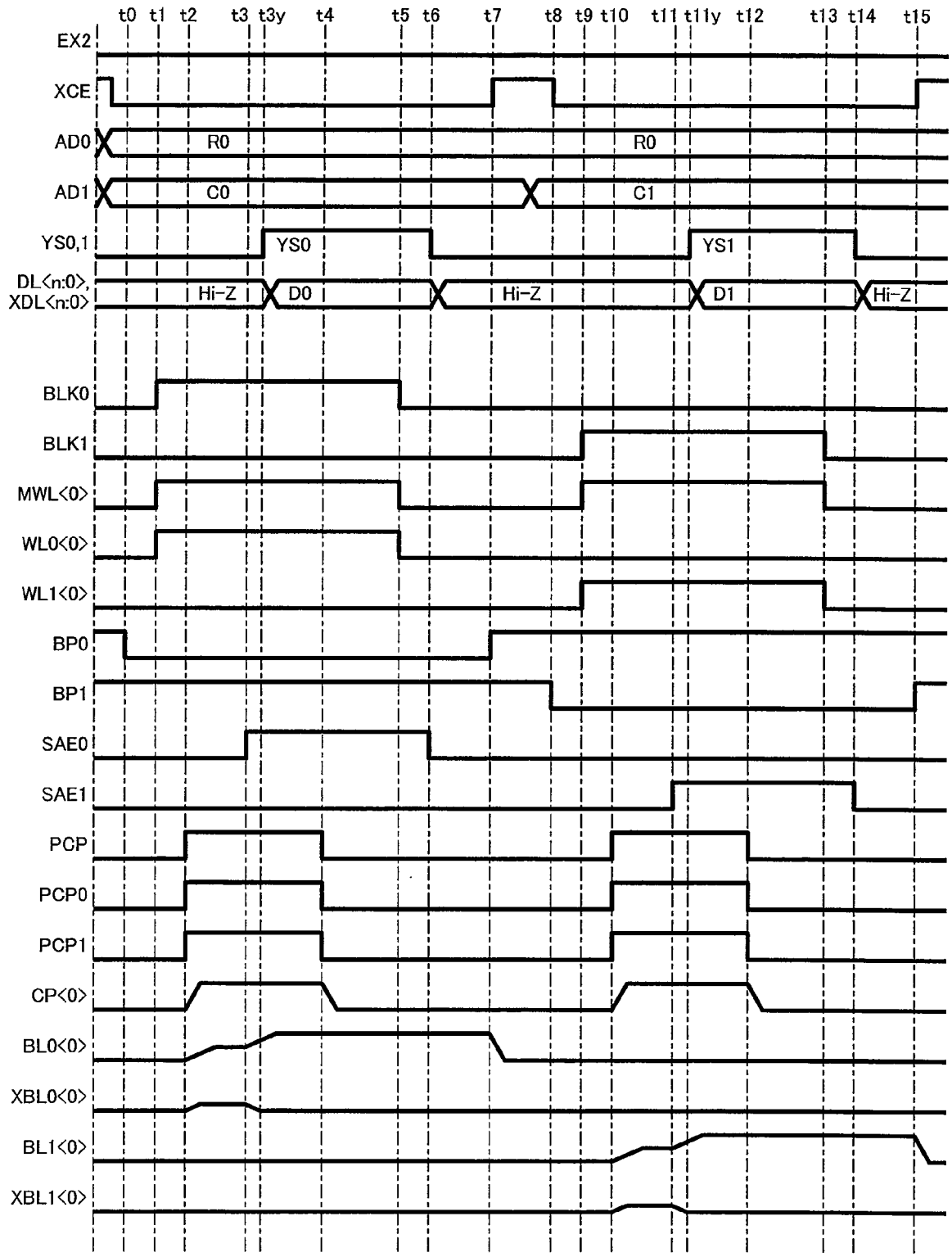
FIG. 16 is a timing diagram showing a read operation by the semiconductor memory system of FIG. 14 in a case where a data transfer rate control signal EX2 is at the L level.

FIG. 16 is a timing diagram showing a read operation by the semiconductor memory system of FIG. 14 in a case where the data transfer rate control signal EX2 is at the L level. At time t0, the timing generation circuit 906 for generating a timing signal for each operation inside the memory is activated by the chip selection signal XCE output from the memory controller 901. Based on the data transfer rate control signal EX2 and the address signal AD1, the column decoder 903 brings the bit line discharge signal BP0 to the L level, thereby stopping the bit line discharge.

At time t1, based on the address signal AD0 output from the memory controller 901, the row decoder 905 brings the main word line MWL<0> to the selected state, thereby activating the cell plate driver 850. At the same time, based on the data transfer rate control signal EX2 and the address signal AD1, the column decoder 903 brings the memory array selection signal BLK0 to the H level, thereby bringing the word line WL0<0> to the selected state. At time t2, the timing generation circuit 906 brings the cell plate control line PCP to the H level. Thus, the cell plate control lines PCP0 and PCP1 are brought to the H level, and the cell plate line CP<0> transitions to the H level, thereby producing a potential difference between the bit lines BL0<0> and XBL0<0>.

At time t3, based on the data transfer rate control signal EX2 and the address signal AD1 output from the memory controller 901, the column decoder 903 brings the sense amplifier activity control signal SAE0 to the H level. Then, the potential difference between the bit lines BL0<0> and XBL0<0> is amplified and, at the same time, L data is re-written to memory cells connected to the bit line XBL0<0>. At time t3y, based on the data transfer rate control signal EX2 and the address signal AD1, the column decoder 903 brings the column selection signal YS0 to the H level. Data D0 is output to the data lines DL<n:0> and XDL<n:0>.

At time t4, the timing generation circuit 906 brings the cell plate control line PCP to the L level, whereby the cell plate control lines PCP0 and PCP1 are brought to the L level, and cell plate line CP<0> transitions to the L level, thereby re-writing H data to memory cells connected to the bit line BL0<0>. At time t5, the row decoder 905 brings the main word line MWL<0> to the non-selected state, thereby stopping the cell plate driver 850, and the column decoder 903 brings the memory array selection signal BLK0 to the L level at the same time, thereby bringing the word line WL0<0> to the non-selected state.

At time t6, the column decoder 903 brings the sense amplifier activity control signal SAE0 to the L level, thereby stopping the sense amplifier, and the column selection signal YS0 is brought to the L level at the same time, thereby stopping the data output to the data lines DL<N:0> and XDL<N:0>. At time t7, the column decoder 903 brings the bit line discharge signal BP0 to the H level, thereby discharging the bit lines. Thus, the first read operation is completed.

At time t8, the timing generation circuit 906 is activated by the chip selection signal XCE output from the memory controller 901. Based on the data transfer rate control signal EX2 and the address signal AD1, the column decoder 903 brings the bit line discharge signal BP1 to the L level, thereby stopping the bit line discharge.

At time t9, as the row decoder 905 brings the main word line MWL<0> to the selected state based on the address signal AD0 output from the memory controller 901, the cell plate driver 850 is activated. At the same time, as the column decoder 903 brings the memory array selection signal BLK1 the H level based on the data transfer rate control signal EX2 and the address signal AD1, the word line WL0<0> is brought to the selected state. At time t10, as the timing generation circuit 906 brings the cell plate control line PCP to the H level, the cell plate control lines PCP0 and PCP1 are brought to the H level, and cell plate line CP<0> transitions to the H level, thereby producing a potential difference between the bit lines BL0<0> and XBL0<0>.

At time t11, as the column decoder 903 brings the sense amplifier activity control signal SAE1 to the H level based on the data transfer rate control signal EX2 and the address signal AD1 output from the memory controller 901, the potential difference between the bit lines BL1<0> and XBL1<0> is amplified and, at the same time, L data is re-written to memory cells connected to the bit line XBL1<0>. At time t11y, the column decoder 903 brings the column selection signal YS1 to the H level based on the data transfer rate control signal EX2 and the address signal AD1, thereby outputting data D1 from the data lines DL<n:0> and XDL<n:0>.

At time t12, as the timing generation circuit 906 brings the cell plate control line PCP to the L level, the cell plate control lines PCP0 and PCP1 are brought to the L level, and the cell plate line CP<0> transitions to the L level, thereby re-writing H data to memory cells connected to the bit line BL1<0>. At time t13, the row decoder 905 brings the main word line MWL<0> to the non-selected state, thereby stopping the cell plate driver 850, and the column decoder 903 brings the memory array selection signal BLK1 to the L level at the same time, thereby bringing the word line WL0<0> to the non-selected state.

At time t14, the column decoder 903 brings the sense amplifier activity control signal SAE1 to the L level to thereby stop the sense amplifier and, at the same time, brings the column selection signal YS1 to the L level to thereby stop the data output to the data lines DL<n:0> and XDL<n:0>. At time t15, the column decoder 903 brings the bit line discharge signal BP1 to the H level, thereby discharging the bit lines. Thus, the second read operation is completed.

Figure 17:
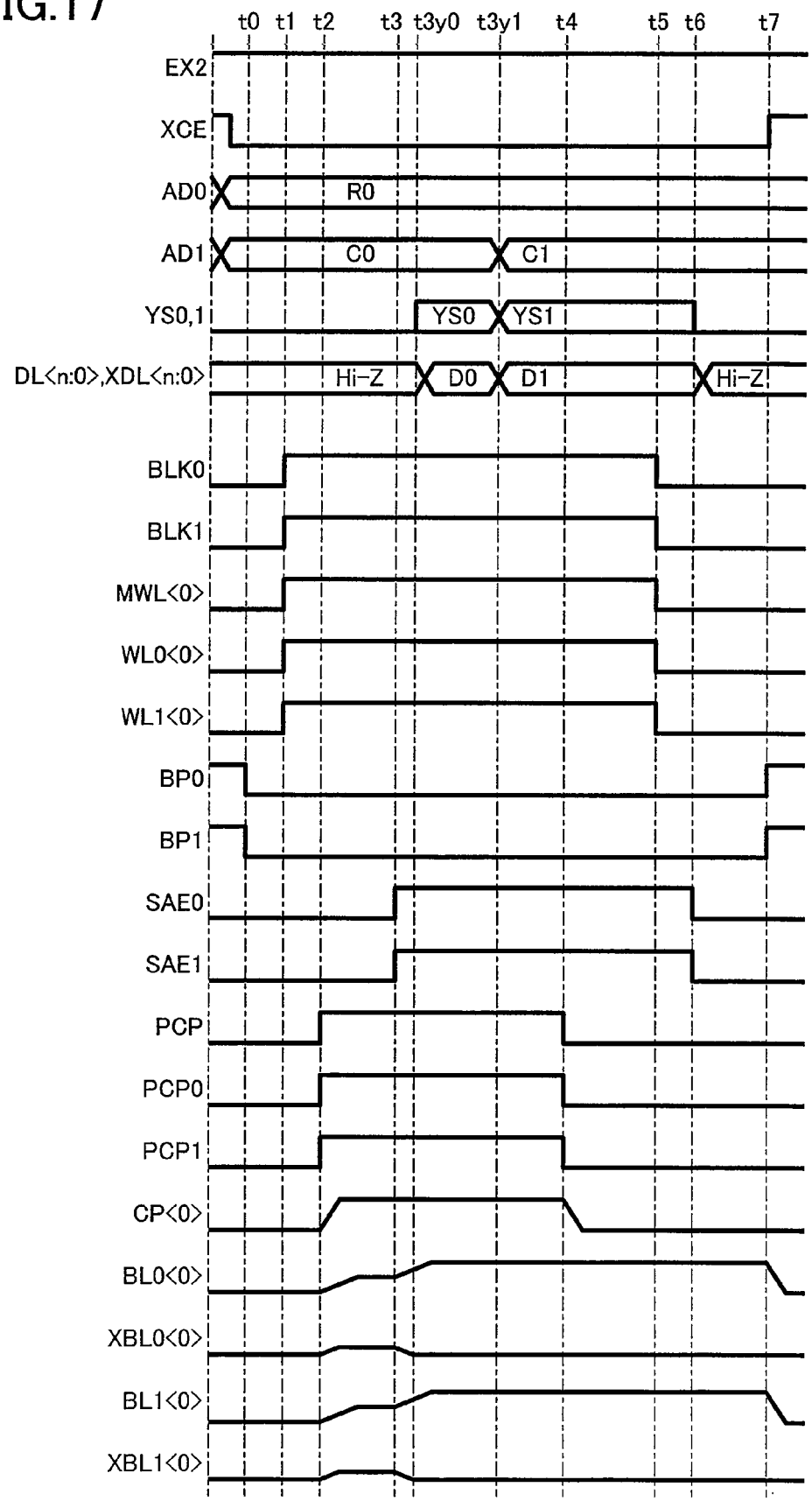
FIG. 17 is a timing diagram showing a read operation by the semiconductor memory system of FIG. 14 in a case where the data transfer rate control signal EX2 is at the H level.

FIG. 17 is a timing diagram showing a read operation by the semiconductor memory system of FIG. 14 in a case where the data transfer rate control signal EX2 is at the H level. The operation at time t0 is similar to that shown in FIG. 16, and will not be further described below. At time t1, based on the address signal AD0 output from the memory controller 901, the row decoder 905 brings the main word line MWL<0> to the selected state, thereby activating the cell plate driver 850. Since the data transfer rate control signal EX2 is at the H level, the column decoder 903 brings the memory array selection signals BLK0 and BLK1 to the H level to thereby bring the word lines WL0<0> and WL1<0> to the selected state.

At time t2, the timing generation circuit 906 brings the cell plate control line PCP to the H level. Thus, the cell plate control lines PCP0 and PCP1 are brought to the H level, and the cell plate line CP<0> transitions to the H level, thereby producing a potential difference between the bit lines BL0<0> and XBL0<0> and between the bit lines BL1<0> and XBL1<0>. At time t3, based on the data transfer rate control signal EX2 and the address signal AD1 output from the memory controller 901, the column decoder 903 brings the sense amplifier activity control signals SAE0 and SAE1 to the H level. Then, the potential difference between the bit lines BL0<0> and XBL0<0> and the potential difference between the bit lines BL1<0> and XBL1<0> are amplified and, at the same time, L data is re-written to memory cells connected to the bit line XBL0<0> or XBL1<0>.

At time t3y0, the column decoder 903 brings the column selection signal YS0 to the H level based on the address signal AD1 (=C0). The data D0 is output to the data lines DL<n:0> and XDL<n:0>. At time t3y1, as the address signal AD1 transitions to C1, the column decoder 903 brings the column selection signals YS0 and YS1 to the L level and the H level, respectively. The data D1 is output to the data lines DL<n:0> and XDL<n:0>.

At time t4, as the timing generation circuit 906 brings the cell plate control line PCP to the L level, the cell plate control lines PCP0 and PCP1 are brought to the L level, and the cell plate line CP<0> transitions to the L level, thereby re-writing H data to memory cells connected to the bit line BL0<0> or BL1<0>. At time t5, the row decoder 905 brings the main word line MWL<0> to the non-selected state, thereby stopping the cell plate driver 850, and the column decoder 903 brings the memory array selection signals BLK0 and BLK1 to the L level at the same time, thereby bringing the word lines WL0<0> and WL1<0> to the non-selected state.

At time t6, the column decoder 903 brings the sense amplifier activity control signals SAE0 and SAE1 to the L level to thereby stop the sense amplifier and, at the same time, brings the column selection signal YS1 to the L level to thereby stop the data output to the data lines DL<n:0> and XDL<n:0>. At time t7, the column decoder 903 brings the bit line discharge signals BP0 and BP1 to the H level, thereby discharging the bit lines. Thus, a read operation is completed.

In the read operation of FIG. 16, the memory controller 901 brings the data transfer rate control signal EX2 to the H level, whereby it is possible to obtain a data output with a transfer rate twice that of FIG. 15. The memory controller 901 may have the data transfer rate control signal EX2 at the L level in a case where the system is operated with a low power consumption, and at the H level in a case where a high data transfer rate is needed. Thus, it is possible to selectively place priority on the power consumption or the data transfer rate of the system.

For example, in a non-contact IC card system, the power supplied to the card varies depending on the communication distance between the reader and the card. Therefore, the system may be operated with a higher data transfer rate when the distance is smaller, and with a lower power consumption when the distance is larger. In other words, the system may be operated with a higher data transfer rate when the system can spare power, and with a lower power consumption when the system should be operated with less power. While the embodiments above have been described with respect to cases where there are two memory blocks, any other number of memory blocks may be provided in the semiconductor memory device 902, and the system can be controlled to activate an intended number of memory blocks.

Figure 18:
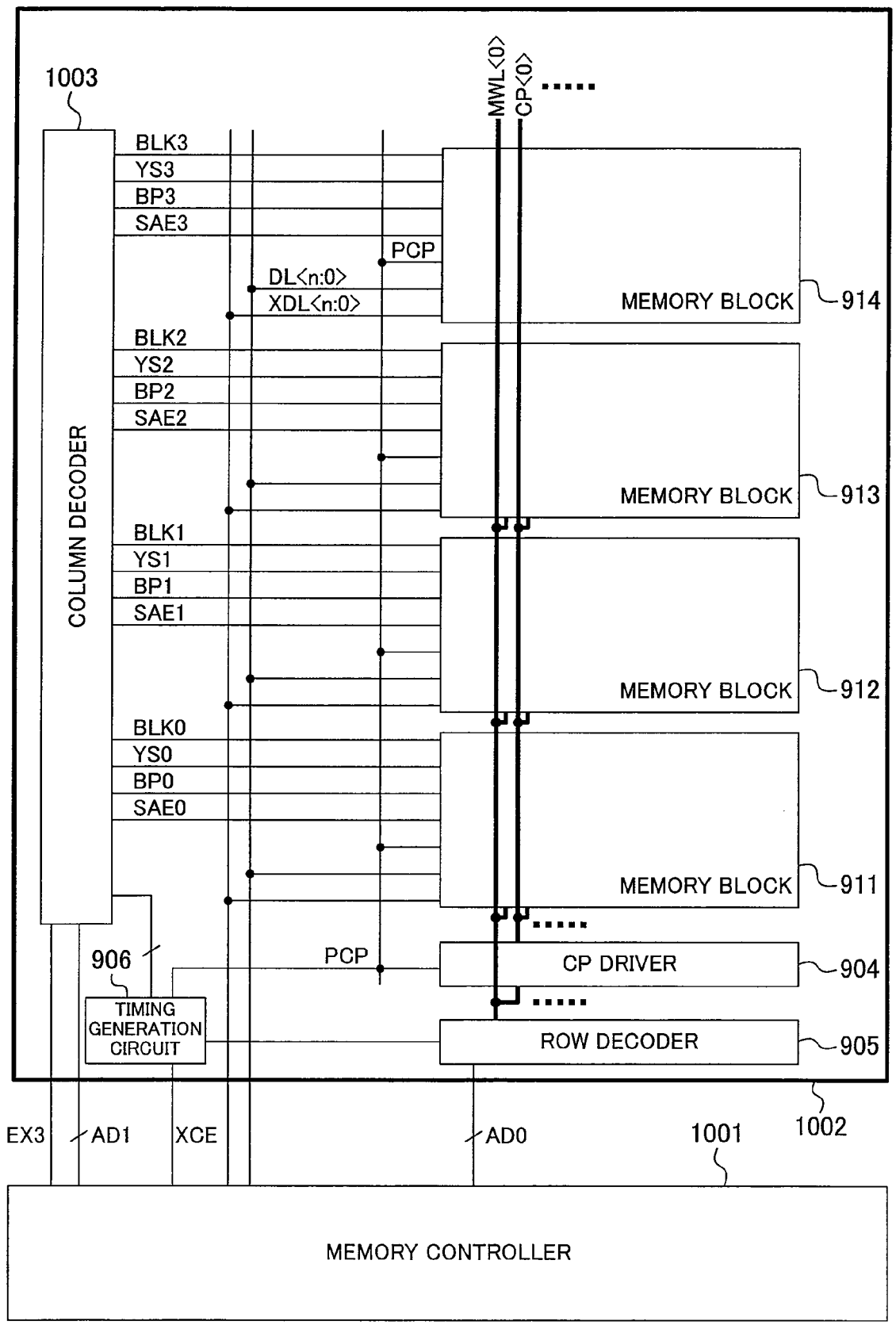
FIG. 18 is a block diagram showing a configuration of a variation of the semiconductor memory system of FIG. 14.

FIG. 18 is a block diagram showing a configuration of a variation of the semiconductor memory system of FIG. 14. The semiconductor memory system of FIG. 18 includes a memory controller 1001, and a semiconductor memory device 1002. The semiconductor memory device 1002 is similar to the semiconductor memory device 902 of FIG. 14, except that the semiconductor memory device 1002 further includes memory blocks 913 and 914 each having a similar configuration to that of the memory block 911 and that a column decoder 1003 is provided instead of the column decoder 903. The memory controller 1001 is similar to the memory controller 901 of FIG. 14, except that an access control signal EX3 is output to the column decoder 1003.

The column decoder 1003 activates the memory blocks 911 to 914 as follows based on the access control signal EX3 and the address signal AD1.

(1) Where the access control signal EX3 is at the L level,
if AD1=C0, the memory block 911 is activated,
if AD1=C1, the memory block 912 is activated,
if AD1=C2, the memory block 913 is activated, and
if AD1=C3, the memory block 914 is activated.

(2) Where the access control signal EX3 is at the H level,
if AD1=C0, the memory blocks 911 and 912 are activated,
if AD1=C1, the memory blocks 912 and 913 are activated,
if AD1=C2, the memory blocks 913 and 914 are activated, and
if AD1=C3, the memory blocks 914 and 911 are activated.

The column decoder 1003 is similar to the column decoder 903 of FIG. 14, except that one or two of the four memory blocks 911 to 914 are selectively accessed.

By bringing the access control signal EX3 to the H level, it is possible to activate a memory block at the address specified by the address signal AD1 and another memory block adjacent thereto. Therefore, it is possible to efficiently access data that lies over two memory blocks.

With the semiconductor memory devices and systems of the embodiments above, it is possible to reduce the chip size and to realize a high-speed operation.

While a 2T2C ferroelectric memory cell is used as an example in the embodiments above, any other suitable type of a memory cell may be used. For example, the present invention may be used with a 1T1C ferroelectric memory cell, or a memory cell including a storage element and a switching element for driving a terminal of the storage element.

A transfer gate may be used as the second cell plate driving element.

As described above, the embodiments of the present invention, being capable of reducing the circuit area, are useful as a semiconductor memory device, and the like.

What is claimed is:

1. A semiconductor memory device, comprising:
 a plurality of memory cell arrays each including a plurality of memory cells arranged in a matrix pattern; and
 a plurality of cell plate lines each being shared by the memory cell arrays, each of the cell plate lines corresponding to each of rows of the memory cells and each of the cell plate lines being connected to the memory cells of a corresponding one of the rows, wherein
 each of the memory cell arrays includes a plurality of word lines each of which corresponds to each of the rows of the memory cells in the memory cell array and each of the word lines is connected to the memory cells of a corresponding one of the rows; and
 the number of the memory cells connected to each of the cell plate lines is larger than the number of the memory cells connected to one of the word lines corresponding to the each of the cell plate lines.

2. The semiconductor memory device of claim 1, further comprising a plurality of first cell plate driving elements each driving a corresponding one of the cell plate lines based on a row decoder signal generated from a row address.

3. The semiconductor memory device of claim 2, further comprising a plurality of second cell plate driving elements each driving a corresponding one of the cell plate lines based on a row decoder signal generated from a row address, each set of two or more of the second cell plate driving elements corresponding to each of the cell plate lines.

4. The semiconductor memory device of claim 3, wherein one or more dummy memory cells are used as at least some of the second cell plate driving elements.

5. The semiconductor memory device of claim 3,
 wherein each of the first cell plate driving elements includes
  a NAND circuit receiving the row decoder signal, and
  an inverter circuit receiving an output signal of the NAND circuit, and wherein each of the second cell plate driving elements is a transfer gate.

6. The semiconductor memory device of claim 1, further comprising a plurality of main word lines each of which corresponds to each of the rows of the memory cells of the memory cell arrays, the main word lines being activated based on a row address, wherein each of the main word lines is connected, via a control element, to one of the word lines of the memory cell arrays that is connected to the memory cells of the row corresponding to the main word line.

7. The semiconductor memory device of claim 6, further comprising a plurality of first cell plate driving elements each driving a corresponding one of the cell plate lines, wherein each of the first cell plate driving elements is controlled by the main word line corresponding to the row of the memory cells connected to one of the cell plate lines that is driven by the each of the first cell plate driving elements.

8. The semiconductor memory device of claim 7, further comprising a plurality of second cell plate driving elements each driving a corresponding one of the cell plate lines, each set of two or more of the second cell plate driving elements corresponding to each of the cell plate lines;

wherein each of the second cell plate driving elements is controlled by the main word line corresponding to the row of the memory cells connected to one of the cell plate lines that is driven by the each of the second cell plate driving elements.

9. The semiconductor memory device of claim 8, wherein one or more dummy memory cells are used as at least some of the second cell plate driving elements.

10. The semiconductor memory device of claim 8,
wherein each of the first cell plate driving elements includes
a NAND circuit receiving a signal of the main word line corresponding to the row of the memory cells connected to one of the cell plate lines that is driven by the each of the first cell plate driving elements, and
an inverter circuit receiving an output signal of the NAND circuit, and
wherein each of the second cell plate driving elements is a transfer gate.

11. The semiconductor memory device of claim 1, wherein each of the memory cells includes a transistor, and a ferroelectric capacitor connected to the transistor.

12. The semiconductor memory device of claim 11, wherein each of the memory cell arrays includes a plurality of bit line pairs each of which corresponds to each of columns of the memory cells of the memory cell array and each of the bit line pairs is connected to the memory cells of a corresponding one of the columns;

the semiconductor memory device further comprises a sense amplifier for amplifying a potential difference read out to each of the bit line pairs; and when the sense amplifier starts the amplification, the transistor of the memory cell on which a read operation is being performed is in a non-conductive state.

13. A semiconductor memory system, comprising:
a semiconductor memory device; and
a memory controller for outputting a control signal for controlling the semiconductor memory device,
wherein the semiconductor memory device includes
a plurality of memory blocks, and
a column decoder for decoding a column address to generate a column selection signal specifying a column to be activated,
wherein each of the memory blocks includes
a plurality of memory cell arrays each including a plurality of memory cells arranged in a matrix pattern, and
a plurality of cell plate lines each being shared by the memory cell arrays, each of the cell plate lines corresponding to each of rows of the memory cells and each of the cell plate lines being connected to the memory cells of a corresponding one of the rows,
wherein each of the memory cell arrays includes a plurality of word lines each of which corresponds to each of the rows of the memory cells in the memory cell array and each of the word lines is connected to the memory cells of a corresponding one of the rows, and
the number of the memory cells connected to each of the cell plate lines is larger than the number of the memory cells connected to one of the word lines corresponding to the each of the cell plate lines, and
wherein the column decoder generates the column selection signal so that the memory block(s) of which number is determined based on the control signal are activated while one of the cell plate lines is active.

14. The semiconductor memory system of claim 13, wherein the column decoder generates the column selection signal so that adjacent ones of the memory blocks are activated.

* * * * *